United States Patent
Maruya et al.

(10) Patent No.: US 8,292,160 B2
(45) Date of Patent: Oct. 23, 2012

(54) METHOD OF MANUFACTURING SEMICONDUCTOR DEVICE, AND BONDING APPARATUS

(75) Inventors: Yusuke Maruya, Tokyo (JP); Nobuyuki Aoyagi, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 13/214,682

(22) Filed: Aug. 22, 2011

(65) Prior Publication Data

US 2011/0315743 A1    Dec. 29, 2011

Related U.S. Application Data

(63) Continuation of application No. PCT/JP2010/050910, filed on Jan. 25, 2010.

(30) Foreign Application Priority Data

Feb. 23, 2009  (JP) .................................. 2009-039448

(51) Int. Cl.
     *B23K 31/02*   (2006.01)
(52) U.S. Cl. ...................................... 228/180.5; 228/4.5
(58) Field of Classification Search ........................ None
     See application file for complete search history.

(56) References Cited

U.S. PATENT DOCUMENTS

| | | | |
|---|---|---|---|
| 4,437,604 A * | 3/1984 | Razon et al. ............... | 228/180.5 |
| 5,024,367 A | 6/1991 | Terakado et al. | |
| 5,121,329 A * | 6/1992 | Crump .......................... | 700/119 |
| 5,523,956 A * | 6/1996 | Cawelti et al. ................. | 228/104 |
| 5,884,835 A * | 3/1999 | Kajiwara et al. ........... | 228/110.1 |
| 6,090,183 A * | 7/2000 | Awaji ................................. | 95/35 |
| 6,705,511 B1 * | 3/2004 | Dames et al. ............... | 228/180.5 |
| 7,096,912 B2 * | 8/2006 | Kakutani ........................ | 156/358 |
| 7,137,547 B2 * | 11/2006 | Wakefield ................... | 228/180.5 |
| 7,326,640 B2 * | 2/2008 | Aoh et al. ..................... | 438/617 |
| 7,909,233 B2 * | 3/2011 | Lee et al. .................... | 228/180.5 |
| 7,918,378 B1 * | 4/2011 | Pham ............................. | 228/4.5 |
| 2003/0168078 A1 * | 9/2003 | Deguchi ......................... | 134/1.3 |
| 2005/0188494 A1 * | 9/2005 | Takenaka ........................ | 15/319 |
| 2006/0027544 A1 * | 2/2006 | Pailthorp et al. ......... | 219/121.71 |
| 2006/0060631 A1 * | 3/2006 | Frasch et al. .................... | 228/4.5 |
| 2007/0235495 A1 * | 10/2007 | Castaneda et al. ............. | 228/4.5 |
| 2009/0038660 A1 * | 2/2009 | Nakane et al. ............. | 134/166 R |
| 2010/0288307 A1 * | 11/2010 | Chung et al. .................... | 134/18 |

(Continued)

FOREIGN PATENT DOCUMENTS

JP          2299249      12/1990

(Continued)

OTHER PUBLICATIONS

Machine translation of JP-06-283564A (no date available).*

(Continued)

*Primary Examiner* — Kiley Stoner
(74) *Attorney, Agent, or Firm* — Katten Muchin Rosenman LLP

(57) ABSTRACT

In a first bonding step of bonding an initial ball to a pad surface, the initial ball is applied by ultrasonic vibration while in pressure contact with the pad surface and a capillary undergoes a scrubbing motion to be rotated spirally. This allows a deformation area of the initial ball to be reduced, whereby the accuracy of bonding can be improved. In a second bonding step of bonding a bonding wire to a lead surface, the capillary and the bonding wire are applied by ultrasonic vibration while in pressure contact with the lead surface and the capillary undergoes a scrubbing motion to be rotated spirally. This allows the bonding wire bonded to the lead surface to be cut reliably.

4 Claims, 17 Drawing Sheets

U.S. PATENT DOCUMENTS

2011/0036381 A1* 2/2011 Zilai et al. .................. 134/168 R

FOREIGN PATENT DOCUMENTS

| JP | 3-77338 | 4/1991 |
|---|---|---|
| JP | 4-372146 | 12/1992 |
| JP | 06-283564 A * | 10/1994 |
| JP | 6-295941 | 10/1994 |

OTHER PUBLICATIONS

International Search Report dated Mar. 2, 2010 from International Application No. PCT/JP2010/050910.

* cited by examiner

|  | Comparative Example | | Practical Example | |
|---|---|---|---|---|
|  | X (μm) | Y (μm) | X (μm) | Y (μm) |
| Max | 138 | 158 | 124 | 127 |
| Min | 122 | 125 | 120 | 123 |
| Ave | 129.1 | 142.8 | 121.9 | 125.8 |
| σ | 4.27 | 11.96 | 1.51 | 1.34 |

FIG. 13

|  | Comparative Example | | Practical Example | |
|---|---|---|---|---|
|  | Bonding width | Tensile strength | Bonding width | Tensile strength |
| Max | 38 | 4.51 | 39 | 4.53 |
| Min | 36 | 3.42 | 37 | 3.53 |
| Ave | 36.8 | 3.97 | 37.9 | 4.00 |
| σ | 0.62 | 0.40 | 0.67 | 0.34 |

FIG. 15

METHOD OF MANUFACTURING SEMICONDUCTOR DEVICE, AND BONDING APPARATUS

BACKGROUND OF THE INVENTION

1. Field of the Invention

The present invention relates to a method for manufacturing a semiconductor device including bonding onto a bonding target, and to bonding apparatuses.

2. Description of the Related Art

Wire-bonding generally includes a first bonding step in which an initial ball is formed at a tip end of a bonding wire to be fed out of a capillary and is applied by ultrasonic vibration while in pressure contact with a pad surface of a semiconductor device to bond the initial ball to the pad surface. In a second bonding step thereafter, the bonding wire is fed out of the capillary to form a wire loop, and the bonding wire and the capillary are brought into pressure contact with a lead surface of a substrate to bond the bonding wire to the lead surface and then cut the bonding wire.

However, the substrate may be in an unstable state such as wobbling on a bonding stage, suffering from a problem in that the initial ball may not be bonded reliably to the pad surface in the first bonding step and/or the bonding wire may not be cut in the second bonding step.

Hence, in the related art described in Japanese Patent No. 2530224, an XY table with a capillary mounted thereon undergoes a scrubbing motion to be moved in the XY direction during bonding, so that an initial ball is rubbed on and bonded reliably to a pad surface.

However, in the related art described in Japanese Patent No. 2530224, the initial ball may be deformed and expanded during the scrubbing motion, while bonded to the pad surface in the first bonding step, to have an enlarged deformation area. For this reason, the related art described in Japanese Patent No. 2530224 suffers from a problem in that accurate bonding onto a small pad surface is difficult and the pad pitch serving as the distance between adjacent pad surfaces, cannot be reduced.

It is noted that the capability of cutting the bonding wire in the second bonding step is still left unsolved even with the related art described in Japanese Patent No. 2530224.

BRIEF SUMMARY OF THE INVENTION

It is hence an object of the present invention to provide a method of manufacturing a semiconductor device and a bonding apparatus with which an initial ball, when bonded to a pad surface of the semiconductor device, can have a small deformation area for improvement in the accuracy of bonding. It is another object of the present invention to provide a method of manufacturing a semiconductor device and a bonding apparatus with which a bonding wire, when bonded to a lead surface of a substrate, can be cut reliably.

The present invention is directed to a method of manufacturing a semiconductor device including: a step of preparing a bonding apparatus including: a bonding stage for placing a bonding target that is provided with a pad surface; a capillary for inserting a bonding wire therethrough, the bonding wire having an initial ball formed at the tip end thereof; and a control unit having pressure contact means for bringing the initial ball into pressure contact with the pad surface of the bonding target placed on the bonding stage and scrubbing means for spirally rotating the capillary in a direction perpendicular to the direction of pressure on the initial ball when the initial ball is in pressure contact with the pad surface; a pressure contact step of controlling the pressure contact means for bringing the initial ball formed at the tip end of the bonding wire that is inserted through the capillary into pressure contact with the pad surface of the bonding target placed on the bonding stage based on a command from the control unit in the bonding apparatus; and a scrubbing step of controlling the scrubbing means for spirally rotating the capillary in a direction perpendicular to the direction of pressure on the initial ball when the initial ball is in pressure contact with the pad surface based on a command from the control unit in the bonding apparatus.

In accordance with the method of manufacturing a semiconductor device according to the present invention, when the initial ball is in pressure contact with the pad surface of the bonding target, rotating the capillary causes the pad surface and the initial ball to be rubbed together while in pressure contact with each other and thereby the initial ball to be bonded to the pad surface. In this case, spirally rotating the capillary allows the force applied to the initial ball to be converged toward the center of rotation and thereby the time and distance where the pad surface and the initial ball are rubbed together at the maximum diameter to be reduced while being secured sufficiently. This allows the deformation area of the initial ball to be reduced, whereby the accuracy of bonding can be improved and the pad pitch serving as the distance between pad surfaces, can be reduced.

In the arrangement above, the scrubbing step preferably includes specifying the position where the initial ball comes into contact with the pad surface as a reference position, spirally rotating the capillary from the reference position while increasing the diameter of the spiral, and thereafter spirally rotating the capillary while reducing the diameter of the spiral to recover the reference position. In accordance with the method of manufacturing a semiconductor device, specifying the position where the initial ball comes into contact with the pad surface as a reference position, spirally rotating the capillary while increasing the diameter of the spiral, and thereafter spirally rotating the capillary while reducing the diameter of the spiral to recover the reference position allows the gap between the position where the initial ball is brought into pressure contact with the pad surface and the position where the initial ball is bonded to the pad surface to be reduced. This allows the accuracy of bonding to be further improved and the pad pitch serving as the distance between pad surfaces, to be further reduced.

The scrubbing step preferably includes, when the pad surface has an extended shape, spirally rotating the capillary in a flattened manner along the direction of extension of the pad surface. In accordance with the method of manufacturing a semiconductor device, spirally rotating the capillary in a flattened manner along the direction of extension of the pad surface allows the shape of the initial ball to be bonded to the pad surface to be accommodated to the shape of the pad surface. This allows the accuracy of bonding to be improved even for a pad surface extending in any direction.

The present invention is also directed to a bonding apparatus including: a bonding stage for placing a bonding target that is provided with a pad surface; a capillary for inserting a bonding wire therethrough, the bonding wire having an initial ball formed at the tip end thereof; and a control unit having pressure contact means for bringing the initial ball into pressure contact with the pad surface of the bonding target placed on the bonding stage and scrubbing means for spirally rotating the capillary in a direction perpendicular to the direction of pressure on the initial ball when the initial ball is in pressure contact with the pad surface.

In accordance with the bonding apparatus according to the present invention, when the initial ball is in pressure contact with the pad surface of the bonding target, rotating the capillary causes the pad surface and the initial ball to be rubbed together while in pressure contact with each other and thereby the initial ball to be bonded to the pad surface. In this case, spirally rotating the capillary allows the force applied to the initial ball to be converged toward the center of rotation and thereby the time and distance where the pad surface and the initial ball are rubbed together at the maximum diameter to be reduced while being secured sufficiently. This allows the deformation area of the initial ball formed due to the movement of the capillary to be reduced, whereby the accuracy of bonding can be improved and the pad pitch serving as the distance between pad surfaces, can be reduced.

The present invention is further directed to a method of manufacturing a semiconductor device including: a step of preparing a bonding apparatus including: a bonding stage for placing a bonding target that is provided with a lead surface; a capillary for inserting a bonding wire therethrough; and a control unit having pressure contact means for bringing the capillary and the bonding wire inserted through the capillary into pressure contact with the lead surface of the bonding target placed on the bonding stage and scrubbing means for spirally rotating the capillary in a direction perpendicular to the direction of pressure on the capillary when the capillary is in pressure contact with the lead surface; a pressure contact step of controlling the pressure contact means for bringing the capillary with the bonding wire inserted therethrough and the bonding wire inserted through the capillary into pressure contact with the lead surface of the bonding target placed on the bonding stage based on a command from the control unit in the bonding apparatus; and a scrubbing step of controlling the scrubbing means for spirally rotating the capillary in a direction perpendicular to the direction of pressure on the capillary when the capillary is in pressure contact with the lead surface based on a command from the control unit in the bonding apparatus.

In accordance with the method of manufacturing a semiconductor device according to the present invention, when the capillary and the bonding wire inserted through the capillary are in pressure contact with the lead surface of the bonding target, the bonding wire is bonded to the lead surface and placed between the capillary and the lead surface to be cut. Then spirally rotating the capillary causes the capillary to be rubbed spirally on the lead surface while in pressure contact with each other, whereby the bonding wire can be cut reliably with a reduced possibility of cutting error.

In the arrangement above, the scrubbing step preferably includes specifying the position where the capillary comes into contact with the lead surface as a reference position, spirally rotating the capillary from the reference position while increasing the diameter of the spiral, and thereafter spirally rotating the capillary while reducing the diameter of the spiral to recover the reference position. In accordance with the method of manufacturing a semiconductor device, specifying the position where the capillary and the bonding wire come into contact with the lead surface as a reference position, spirally rotating the capillary while increasing the diameter of the spiral, and thereafter spirally rotating the capillary while reducing the diameter of the spiral to recover the reference position allows the gap between the position where the capillary is brought into pressure contact with the lead surface and the position of an impression produced on the lead surface when the capillary is brought into pressure contact therewith to be reduced. This allows the accuracy of bonding to be further improved and the lead pitch, the distance between lead surfaces, to be further reduced.

The scrubbing step preferably includes, when the lead surface has an extended shape, spirally rotating the capillary in a flattened manner along the direction of extension of the lead surface. In accordance with the method of manufacturing a semiconductor device, spirally rotating the capillary in a flattened manner along the direction of extension of the lead surface allows the shape of an impression of the capillary produced on the lead surface to be accommodated to the shape of the lead surface. This allows the accuracy of bonding to be improved even for a lead surface extending in any direction.

The present invention is also directed to a bonding apparatus including: a bonding stage for placing a bonding target that is provided with a lead surface; a capillary for inserting a bonding wire therethrough; and a control unit having pressure contact means for bringing the capillary and the bonding wire inserted through the capillary into pressure contact with the lead surface of the bonding target placed on the bonding stage and scrubbing means for spirally rotating the capillary in a direction perpendicular to the direction of pressure on the capillary when the capillary is in pressure contact with the lead surface.

In accordance with the bonding apparatus according to the present invention, when the capillary and the bonding wire inserted through the capillary are in pressure contact with the lead surface of the bonding target, the bonding wire is bonded to the lead surface and placed between the capillary and the lead surface to be cut. Then spirally rotating the capillary causes the capillary to be rubbed spirally on the lead surface while in pressure contact with each other, whereby the bonding wire can be cut reliably with a reduced possibility of cutting error.

The present invention offers the advantage that an initial ball, when bonded to a pad surface of the semiconductor device, can have a small deformation area for improvement in the accuracy of bonding. The present invention also offers the advantage that a bonding wire, when bonded to a lead surface of a substrate, can be cut reliably.

BRIEF DESCRIPTION OF THE SEVERAL
VIEWS OF THE DRAWINGS

Exemplary embodiments of the present invention will be described in detail based on the following figures, wherein:

FIG. 13 is a table showing the diameters of initial balls bonded to pad surfaces according to an exemplary embodiment of the present invention;

FIG. 15 is a table showing the tensile strength of bonding wires bonded to lead surfaces according to an exemplary embodiment of the present invention;

Figure 16A:
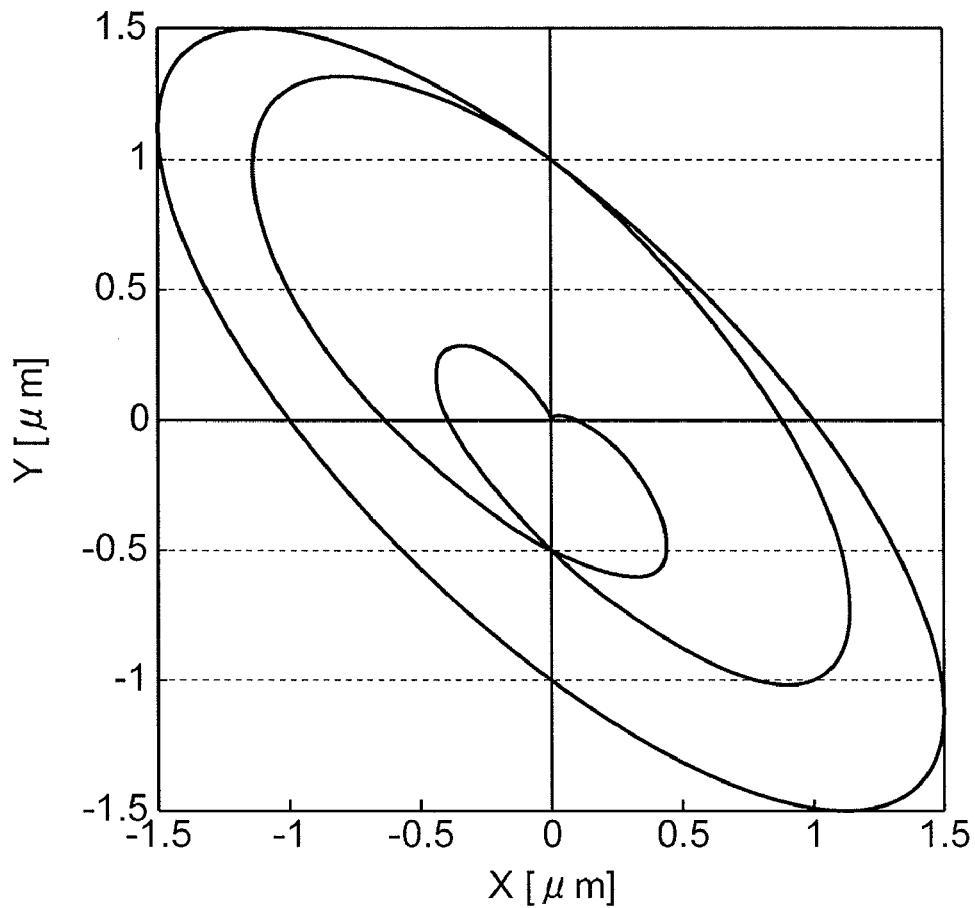
FIG. 16(a) illustrates a movement trajectory of the capillary when rotated spirally in an obliquely flattened manner according to an exemplary embodiment of the present invention.
Figure 16B:
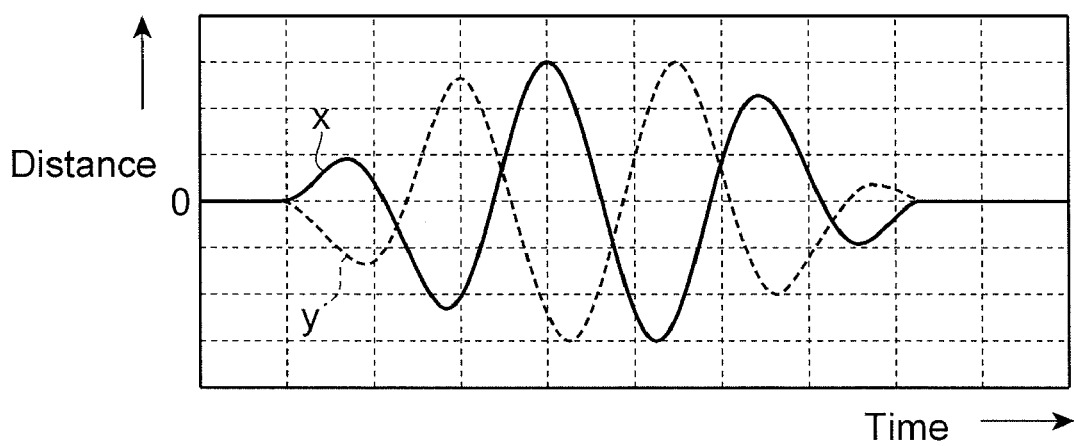
Figure 17A:
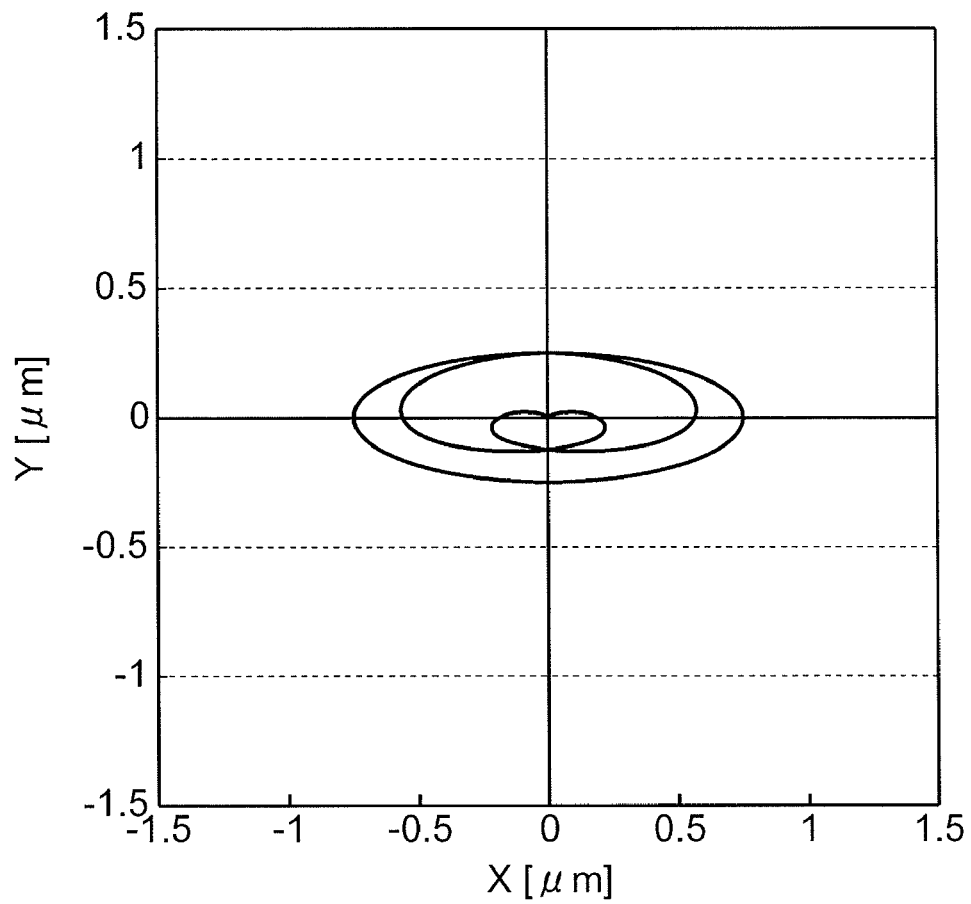
Figure 17B:
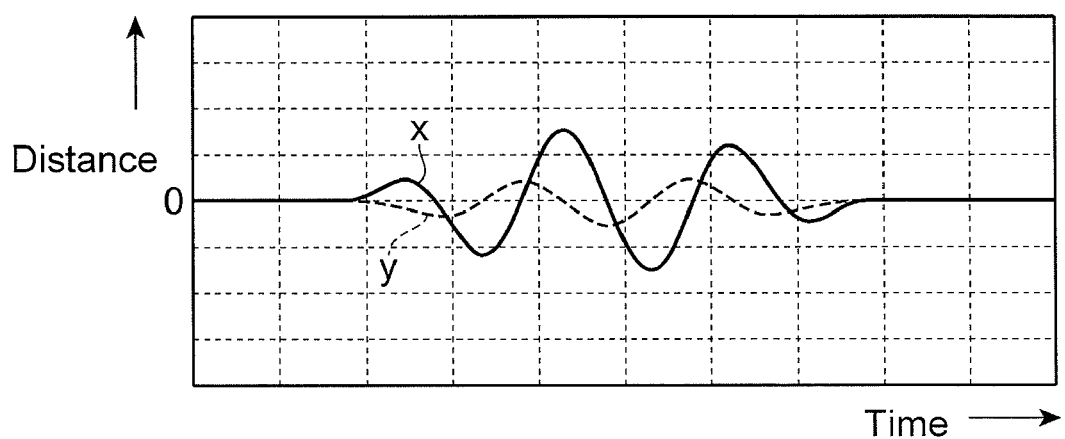

FIG. 16(b) illustrates a command position for driving the X-axis linear motor and the Y-axis linear motor in the case of FIG. 16(a) according to an exemplary embodiment of the present invention; and FIG. 17(a) illustrates a movement trajectory of the capillary when rotated spirally in a laterally flattened manner according to an exemplary embodiment of the present invention; and FIG. 17(b) illustrates a command position for driving the X-axis linear motor and the Y-axis linear motor in the case of FIG. 17(a) according to an exemplary embodiment of the present invention.

DETAILED DESCRIPTION OF THE INVENTION

A method for manufacturing a semiconductor device and a bonding apparatus according to preferred exemplary embodiments of the present invention will hereinafter be described in detail with reference to the accompanying drawings. The first exemplary embodiment is an application of the present invention to a wire-bonding apparatus, while the second exemplary embodiment is an application of the present invention to a bump-bonding apparatus. It is noted that identical or equivalent components in the drawings are designated by the same reference numerals.

[First Exemplary Embodiment]

Figure 1:
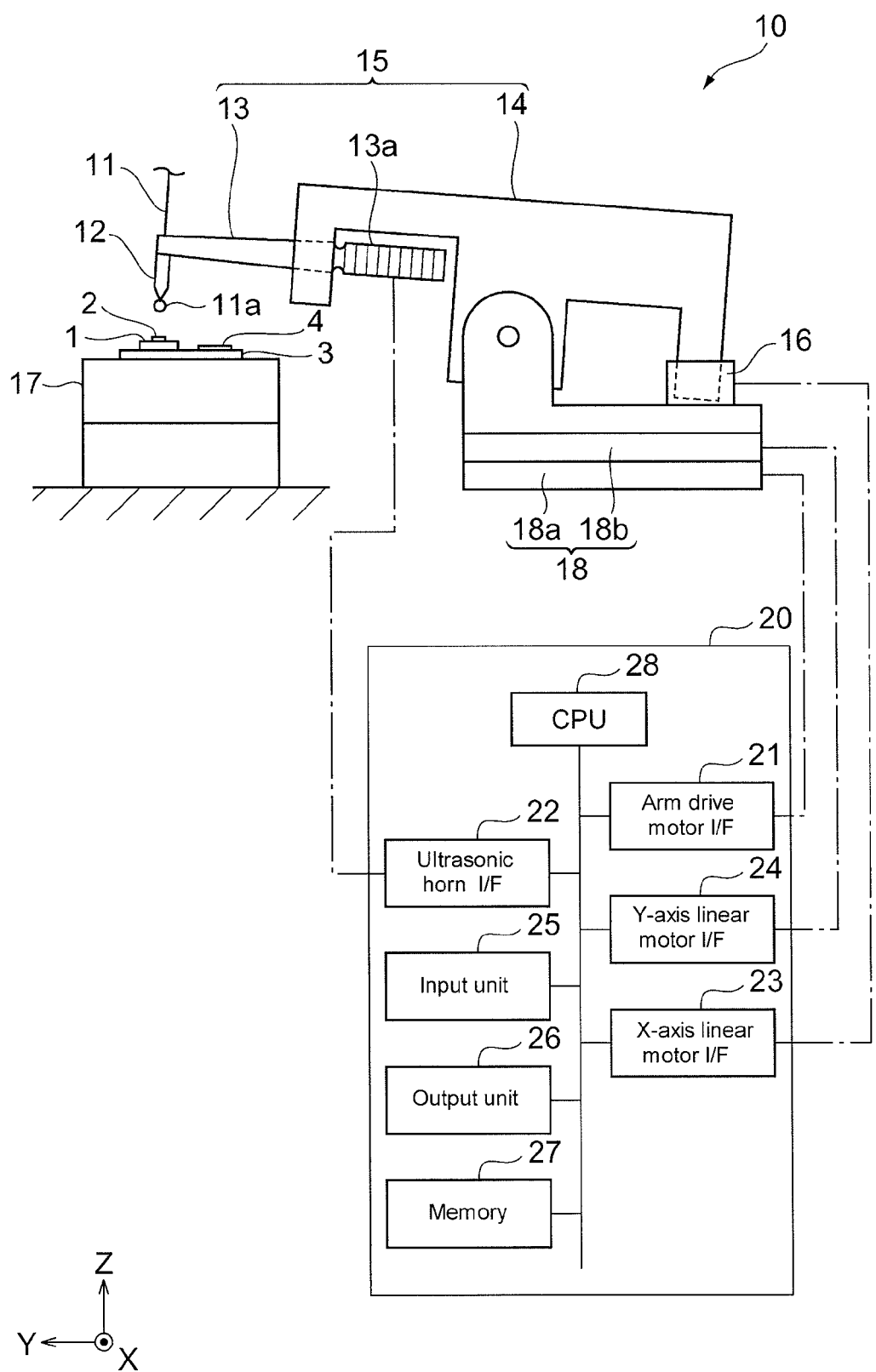
FIG. 1 illustrates an example of a wire-bonding apparatus according to a first exemplary embodiment of the present invention.

FIG. 1 illustrates an example of a wire-bonding apparatus according to a first exemplary embodiment. As shown in FIG. 1, the wire-bonding apparatus 10 according to the first exemplary embodiment is configured to electrically connect a pad surface 2 provided on a semiconductor device 1 and a lead surface 4 provided on a substrate 3 on which the semiconductor device 1 is bonded, through wire bonding using a bonding wire 11 inserted through a capillary 12. The wire-bonding apparatus 10 thus includes the capillary 12 through which the bonding wire 11 is inserted, a bonding head 15 for holding the capillary 12, an arm drive motor 16 for rotating (swinging) the bonding head 15, a bonding stage 17 on which the substrate 3 is placed as a bonding target, an XY movement mechanism 18 for moving the bonding head 15 horizontally in X- and Y-axis directions, and a control unit 20 for integrally controlling the wire-bonding apparatus 10.

The bonding head 15 is configured to include an ultrasonic horn 13 extending from the bonding head 15 toward the bonding stage 17 and having the capillary 12 on one end while a vibrator 13a for providing ultrasonic vibration on the other end, and a bonding arm 14 for holding the ultrasonic horn 13. With this configuration, rotatably driving the arm drive motor 16 causes the ultrasonic horn 13 and therefore the capillary 12 to move vertically in the Z-axis direction, which allows the bonding wire 11 to be bonded to the substrate 3 and the semiconductor device 1 placed on the bonding stage 17. Then providing ultrasonic vibration from the vibrator 13a of the ultrasonic horn 13 allows the capillary 12 held by the bonding arm 14 to be vibrated.

The arm drive motor 16 is configured to be rotatably (swingably) driven to move the capillary 12 vertically in the Z-axis direction. The arm drive motor 16 can then adjust the load on the capillary 12 by adjusting the output torque of the rotary drive.

The XY movement mechanism 18 is configured to move the bonding head 15 in the X- and Y-axis directions. The XY movement mechanism 18 is therefore provided with an X-axis linear motor 18a for moving the bonding head 15 in the X-axis direction and a Y-axis linear motor 18b for moving the bonding head 15 in the Y-axis direction. It is noted that the XY movement mechanism 18 is composed of, for example, a linear motor mechanism, in which the rotation of the X-axis linear motor 18a and the Y-axis linear motor 18b allows for the movement of the bonding head 15 in the respective X- and Y-axis directions. Then rotating the X-axis linear motor 18a and the Y-axis linear motor 18b causes the bonding head 15 to move in the respective X- and Y-axis directions, whereby the capillary 12 can be moved in the X- and Y-axis directions.

The control unit 20 is electrically connected to the ultrasonic horn 13 (vibrator 13a), arm drive motor 16, X-axis linear motor 18a, and Y-axis linear motor 18b to control the ultrasonic horn 13, arm drive motor 16, X-axis linear motor 18a, and Y-axis linear motor 18b for wire bonding.

That is, the control unit 20 has a pressure contact feature (means) for bringing an initial ball 11a of the bonding wire 11 into pressure contact with the pad surface 2 of the semiconductor device 1 bonded to the substrate 3 that is placed on the bonding stage 17 and a scrubbing feature (means) for spirally rotating the capillary 12 in a direction perpendicular to the direction of pressure on the initial ball 11a when the initial ball 11a is in pressure contact with the pad surface 2, in a first bonding step of bonding the bonding wire 11 inserted through the capillary 12 to the pad surface 2 provided on the semiconductor device 1. The control unit 20 also has a pressure contact feature (means) for bringing the capillary 12 and an initial ball 11a of the bonding wire 11 inserted through the capillary 12 into pressure contact with the lead surface 4 of the substrate 3 that is placed on the bonding stage 17 and a scrubbing feature (means) for spirally rotating the capillary 12 in a direction perpendicular to the direction of pressure on the capillary 12 when the capillary 12 is in pressure contact with the lead surface 4, in a second bonding step of bonding the bonding wire 11 bonded to the pad surface 2 to the lead surface 4 provided on the substrate 3. It is noted that these pressure contact and scrubbing features are implemented, respectively, by a pressure contact program and a scrubbing program stored in a storage device or the like.

The control unit 20 is therefore provided with an arm drive motor I/F 21 for transmitting and receiving a signal to/from the arm drive motor 16, an ultrasonic horn I/F 22 for transmitting and receiving a signal to/from the ultrasonic horn 13, an X-axis linear motor I/F 23 for transmitting and receiving a signal to/from the X-axis linear motor 18a, a Y-axis linear motor I/F 24 for transmitting and receiving a signal to/from the Y-axis linear motor 18b, an input unit 25 serving as an input device such as a keyboard to receive an input of various types of control information from an operator, an output unit 26 serving as a display device such as a monitor to display various types of control information for the control unit 20, a memory 27 for storing various types of programs, and a CPU 28 for bonding control.

Figure 2:
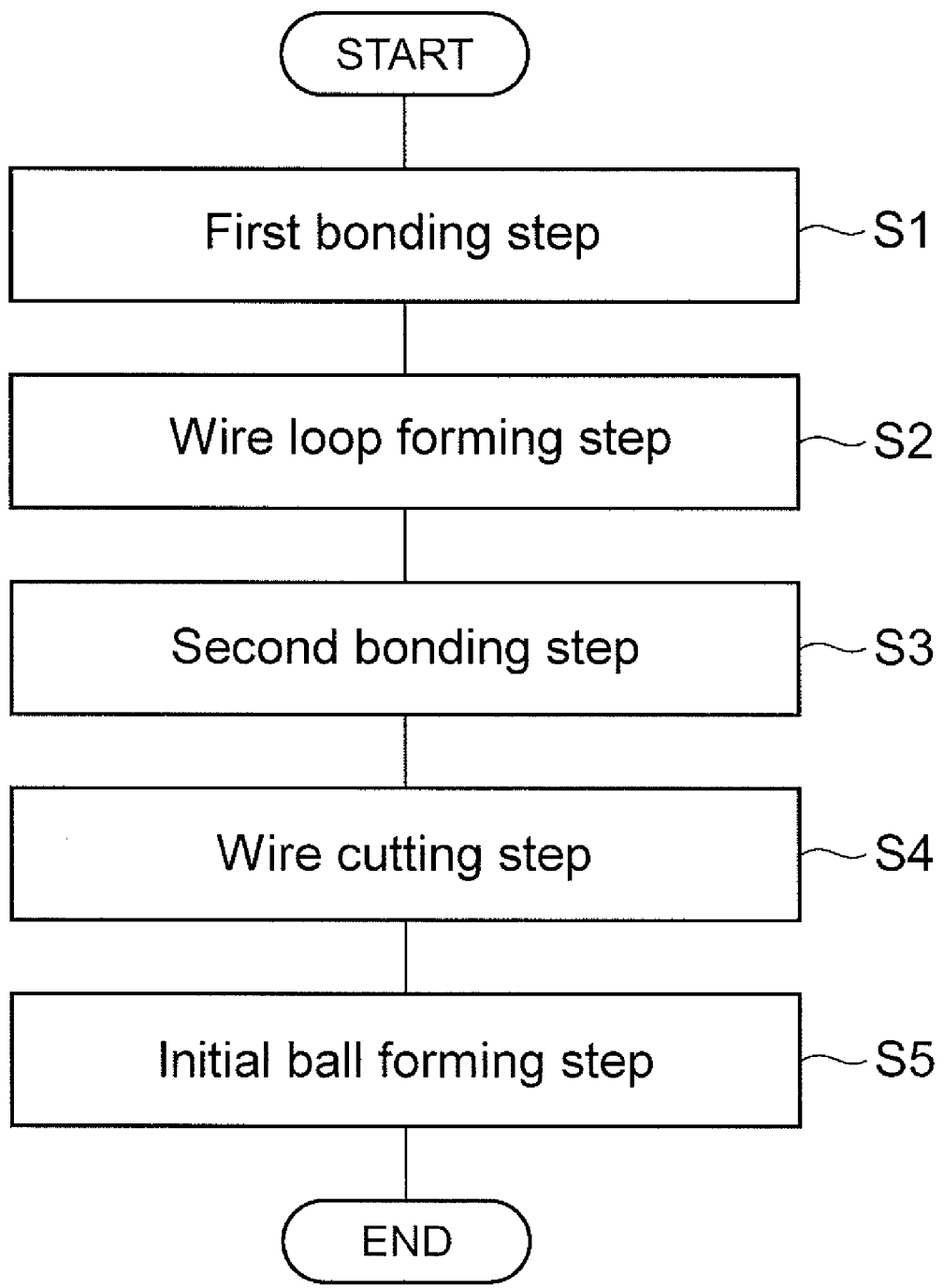
FIG. 2 is a flow chart illustrating a bonding method using the wire-bonding apparatus according to an exemplary embodiment of the present invention.
Figure 3:
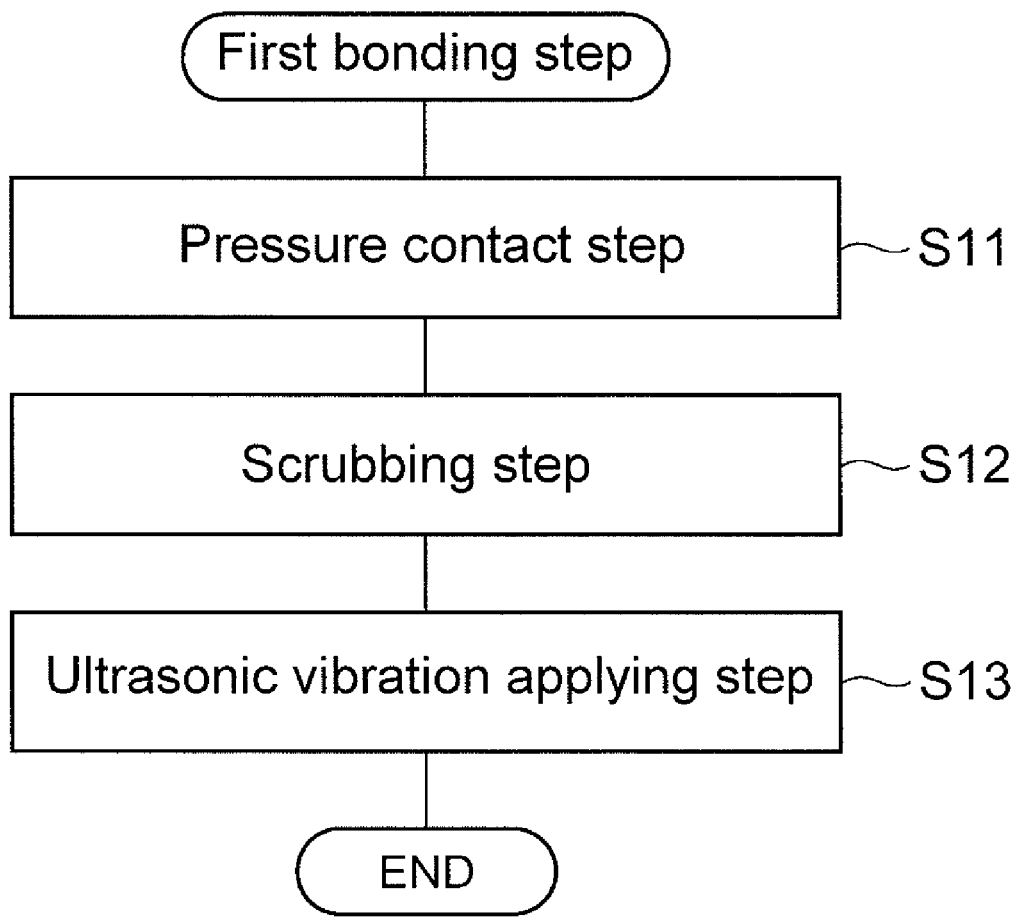
FIG. 3 is a flow chart illustrating the first bonding step in FIG. 2 according to an exemplary embodiment of the present invention.
Figure 4:
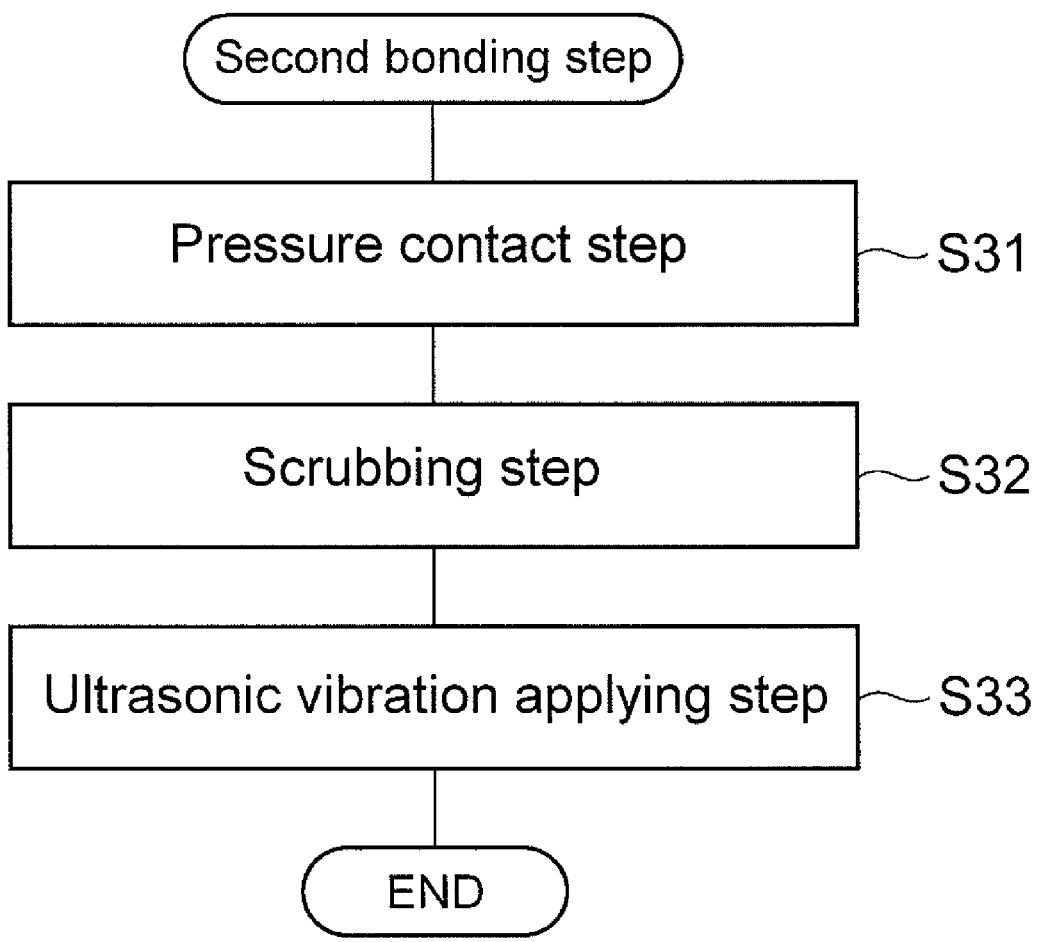
FIG. 4 is a flow chart illustrating the second bonding step in FIG. 2 according to an exemplary embodiment of the present invention.

Next will be described a processing operation of the wire-bonding apparatus 10 with reference to FIGS. 2 to 4. FIG. 2 is a flow chart illustrating a bonding method using the wire-bonding apparatus, FIG. 3 is a flow chart illustrating the first bonding step in FIG. 2, and FIG. 4 is a flow chart illustrating the second bonding step in FIG. 2. It is noted that the processing operation of the wire-bonding apparatus 10 to be described hereinafter is implemented by the pressure contact feature as a pressure contact program and the scrubbing feature as a scrubbing program based on a command from the control unit 20.

First of all, the wire-bonding apparatus 10 runs a first bonding step (Step S1), as shown in FIG. 2.

In the first bonding step (Step S1), a pressure contact step is first performed (Step S11), as shown in FIG. 3. In the pressure contact step, the arm drive motor 16 is rotatably driven and the capillary 12 is lowered. In this case, since a spherical initial ball 11a is formed at the tail of the bonding wire 11 inserted through the capillary 12, lowering the capillary 12 causes the initial ball 11a to come into contact with the pad surface 2. After the initial ball 11a comes into contact with the pad surface 2, the output torque of the arm drive motor 16 is adjusted to apply a predetermined load to the initial ball 11a via the capillary 12 and to bring the initial ball 11a into pressure contact with the pad surface 2.

A scrubbing step is next performed (Step S12). In the scrubbing step, when the initial ball 11a is brought into pressure contact with the pad surface 2, the bonding head 15 is moved and the capillary 12 undergoes a scrubbing motion to be rotated spirally. It is noted that the scrubbing motion can occur at any timing regardless of the period of ultrasonic vibration in an ultrasonic vibration applying step to be described hereinafter as long as while the initial ball 11a is in pressure contact with the pad surface 2.

Figure 5A:
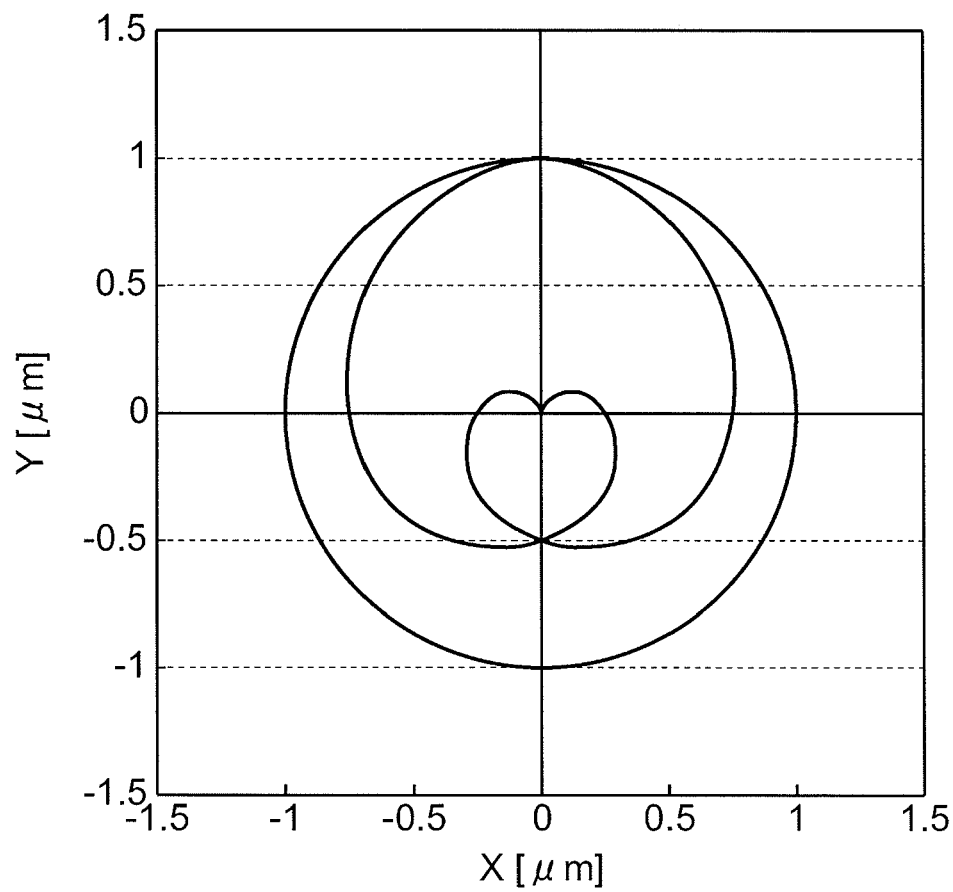
FIG. 5(a) illustrates a movement trajectory of a capillary in a scrubbing motion and FIG. 5(b) illustrates a command position for driving an X-axis linear motor and a Y-axis linear motor according to an exemplary embodiment of the present invention.

Here will be described the scrubbing motion in Step S12 with reference to FIG. 5. FIG. 5(a) illustrates a movement trajectory of the capillary in a scrubbing motion and FIG. 5(b) illustrates a command position for driving the X-axis linear motor and the Y-axis linear motor.

As shown in FIG. 5(a), the scrubbing motion drives the X-axis linear motor and the Y-axis linear motor to spirally rotate the capillary 12 held by the bonding head 15 and therefore the initial ball 11a with respect to the pad surface 2.

Specifically, the scrubbing motion specifies the position where the initial ball 11a comes into contact with the pad surface 2 as a reference position (0, 0), spirally rotates the capillary 12 from the reference position while increasing the radius of rotation and, when the radius of rotation reaches its maximum value, spirally rotates the capillary 12 while reducing the radius of rotation to recover the reference position. It is noted that if the pad surface 2 is a 35-μm square and the initial ball 11a is a 20-μm diameter sphere, the maximum diameter of the spiral rotation is about 20 μm.

Figure 5B:
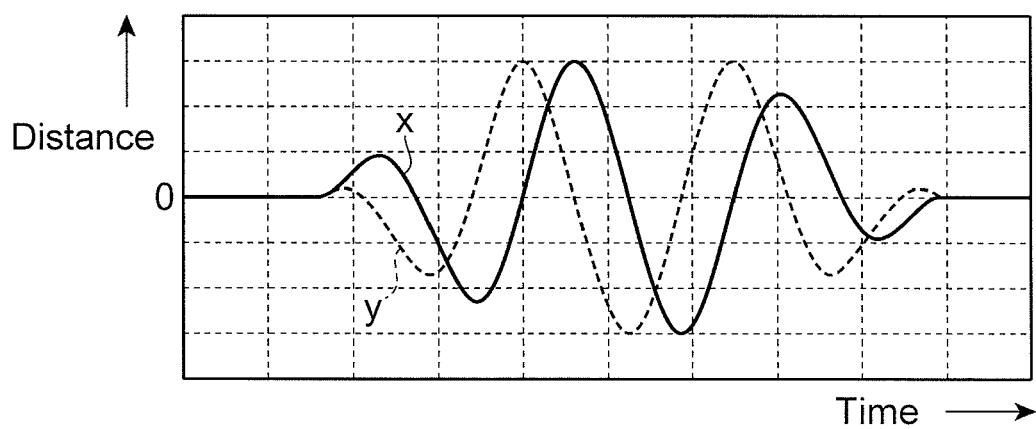

The scrubbing motion occurs when the control unit 20 controls the driving of the X-axis linear motor 18a and the Y-axis linear motor 18b based on an X-axis command position "x" and a Y-axis command position "y" shown in FIG. 5(b).

Figure 6:
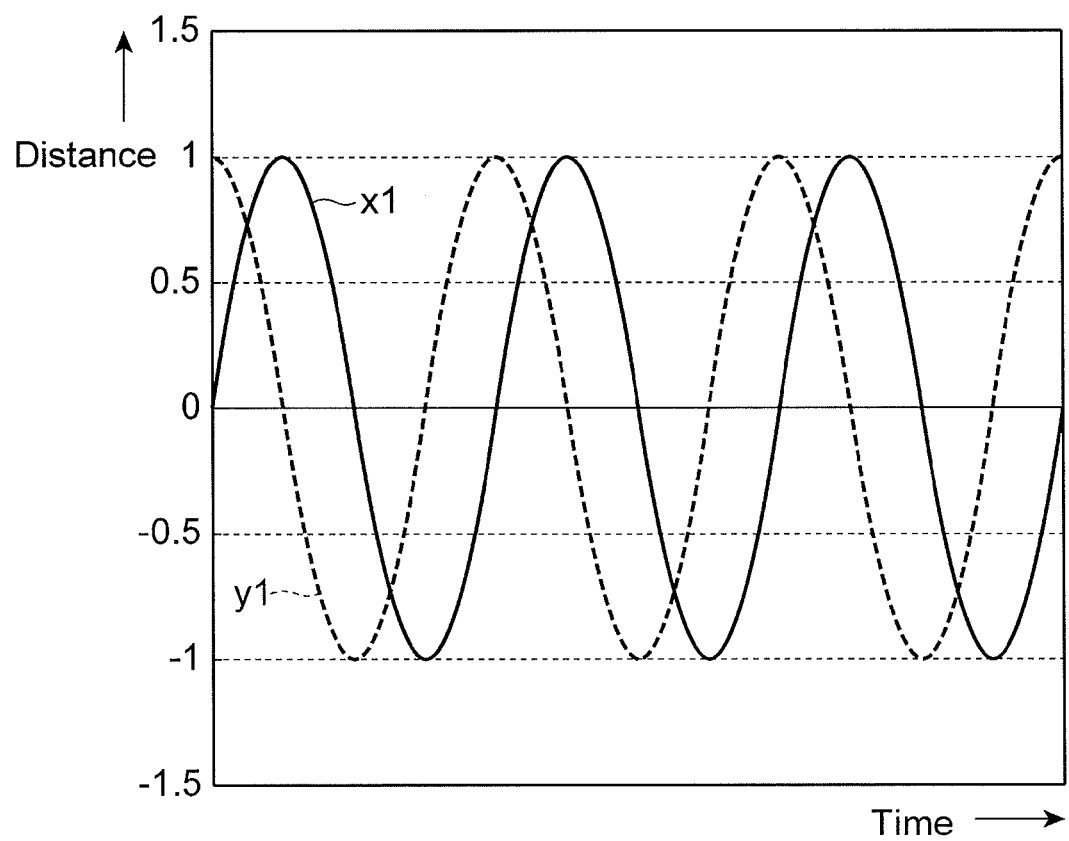
FIG. 6 illustrates an X-axis provisional command position and a Y-axis provisional command position according to an exemplary embodiment of the present invention.

Here will be described a method for calculating the X-axis command position "x" and the Y-axis command position "y" shown in FIG. 5(b) with reference to FIGS. 6 and 7. FIG. 6 illustrates an X-axis provisional command position and a Y-axis provisional command position, and FIG. 7 illustrates the motional ratio between the X-axis provisional command position and the Y-axis provisional command position.

First of all, a sinusoidal wave serving as a basis of a circular motion is used to prepare an X-axis provisional command position x1 to be an X-axis command position and a Y-axis provisional command position y1 to be a Y-axis command position, as shown in FIG. 6. The X-axis provisional command position x1 is represented by a 3-cycle sine curve, and the Y-axis provisional command position y1 is represented by a 3-cycle cosine curve with the phase shifted 90 degrees from the X-axis provisional command position x1.

Figure 7:
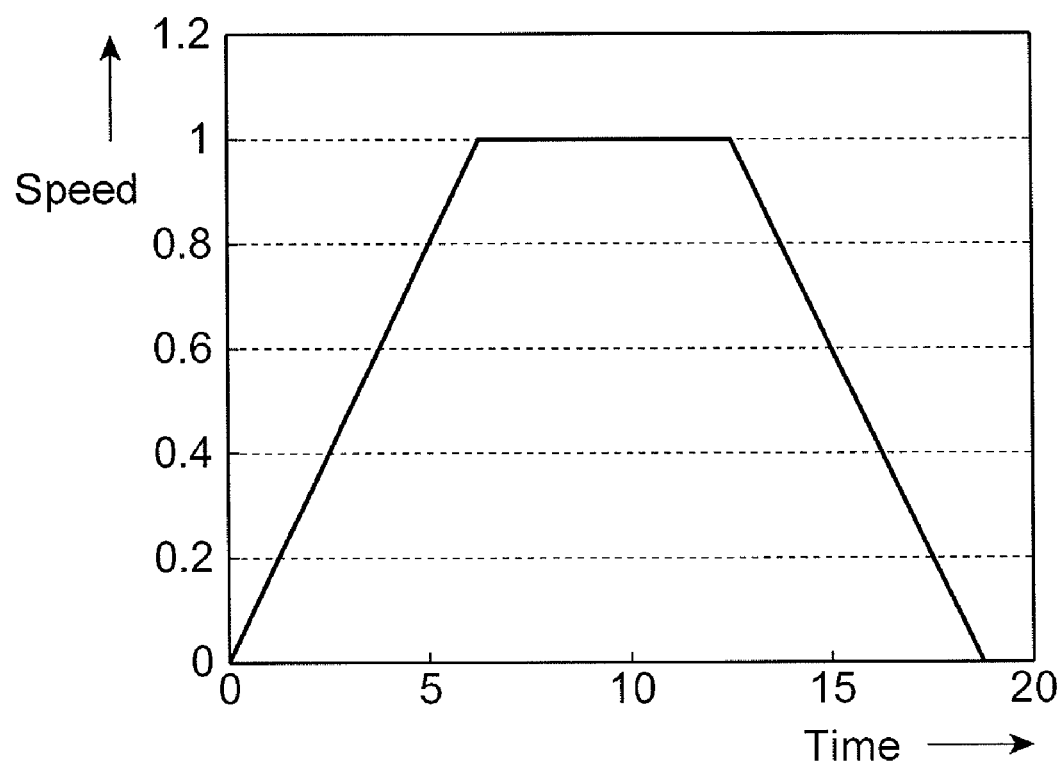
FIG. 7 illustrates the motional ratio between the X-axis provisional command position and the Y-axis provisional command position according to an exemplary embodiment of the present invention.

Next, the motional ratio between the X-axis provisional command position x1 and the Y-axis provisional command position y1 is prepared as shown in FIG. 7. That is, the motional ratio shown in FIG. 7 indicates the speed ratio at which the capillary 12 moves. The motional ratio rises linearly from 0 to 1 during the first cycle, remains 1 during the next cycle, and falls linearly from 1 to 0 during the last cycle. This means that the capillary 12 is accelerated linearly from the speed ratio of 0 to 1 during the first cycle, travels at a constant speed with the speed ratio of 1 during the second cycle, and is decelerated linearly from the speed ratio of 1 to 0 to be stopped during the third cycle.

Then the X-axis provisional command position x1 and the Y-axis provisional command position y1 shown in FIG. 6 are combined with the motional ratio shown in FIG. 7 to calculate the X-axis command position "x" and the Y-axis command position "y" shown in FIG. 5(b).

Figure 8:
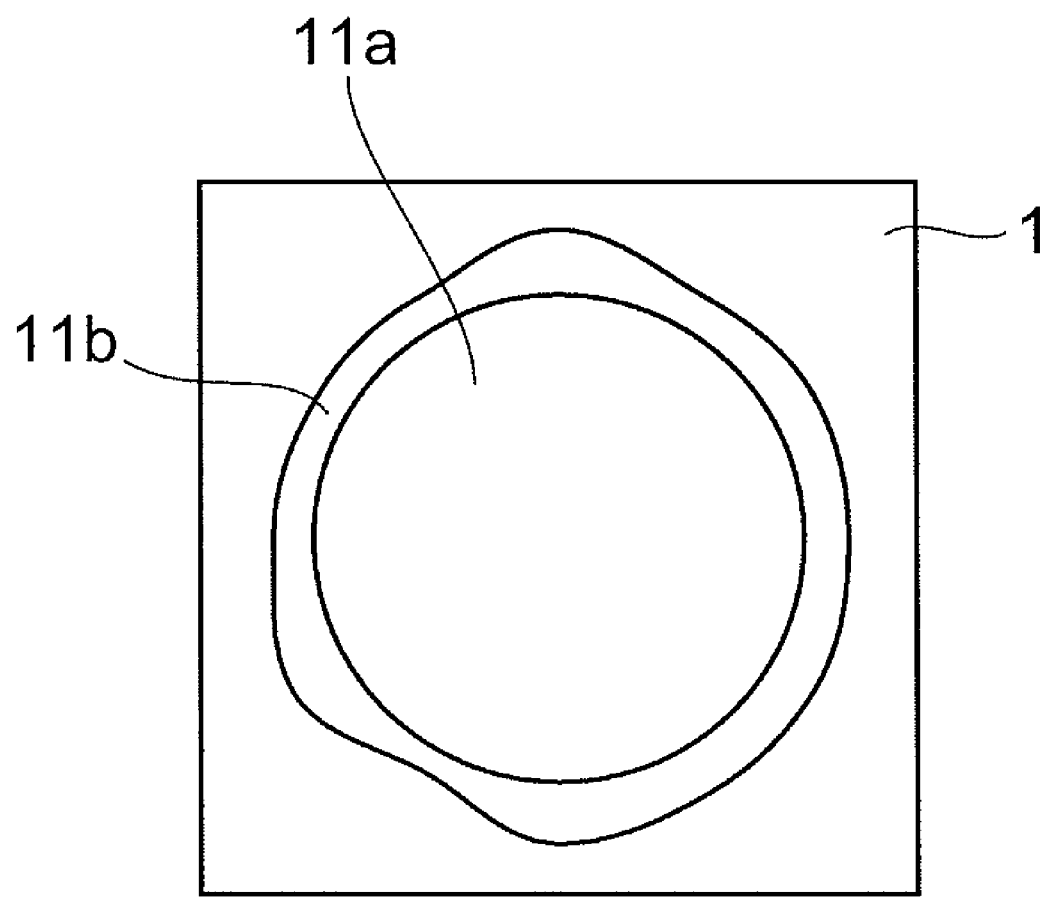
FIG. 8 illustrates a deformation area of an initial ball according to an exemplary embodiment of the present invention.

Thus moving the capillary 12 for scrubbing motion causes the initial ball 11a and the pad surface 2 to be rubbed together and thereby the oxide film (not shown) forming a superficial layer of the pad surface 2 to be broken, so that the initial ball 11a is bonded to the pad surface 2. In this case, the initial ball 11a is rubbed on the pad surface 2 and deformed to possibly have a deformation area 11b expanded outward in the radial direction of the scrubbing motion, as shown in FIG. 8. However, since the capillary 12 undergoes the scrubbing motion to be rotated spirally, the time and distance where the initial ball 11a and the pad surface 2 are rubbed together when the capillary 12 is rotated at the maximum diameter can be reduced and the force applied to the initial ball 11a can be converged toward the center of rotation. This allows the deformation area 11b not to be expanded but to be reduced.

An ultrasonic vibration applying step is next performed (Step S13). In the ultrasonic vibration applying step, when the initial ball 11a is brought into pressure contact with the pad surface 2, ultrasonic vibration is provided from the vibrator 13a of the ultrasonic horn 13. The ultrasonic vibration from the vibrator 13a is then transferred to the initial ball 11a through the ultrasonic horn 13 and the capillary 12. This causes the initial ball 11a to undergo ultrasonic vibration and thereby the initial ball 11a and the pad surface 2 to be rubbed finely together, so that the initial ball 11a is bonded firmly to the pad surface 2.

After the first bonding step, a wire loop forming step is performed (Step S2), as shown in FIG. 2. In the wire loop forming step, the bonding wire 11, the initial ball 11a of which is bonded to the pad surface 2, is fed out of the capillary 12 to form a wire loop and is brought into contact with the lead surface 4.

A second bonding step is next performed (Step S3).

In the second bonding step (Step S3), a pressure contact step is first performed (Step S31), as shown in FIG. 4. In the pressure contact step, the arm drive motor 16 is rotatably driven and the capillary 12 is lowered to bring the bonding wire 11 and the capillary 12 into contact with the lead surface 4. That is, the output torque of the arm drive motor 16 is adjusted to apply a predetermined load to the capillary 12 and to bring the capillary 12 into pressure contact with the lead surface 4 to a degree where the bonding wire 11 is squashed with the capillary 12. This causes the bonding wire 11 to be bonded to the lead surface 4.

A scrubbing step is next performed (Step S32). In the scrubbing step, the capillary 12 undergoes a scrubbing motion to be rotated spirally, as is the case with the scrubbing step (Step S12) in the first bonding step (Step S1). The scrubbing motion then leads to the bonding wire 11 being squashed between the capillary 12 and the lead surface 4.

An ultrasonic vibration applying step is next performed (Step S33). In the ultrasonic vibration applying step, ultrasonic vibration is provided from the vibrator 13a of the ultrasonic horn 13 and applied to the initial ball 11a, as is the case with the ultrasonic vibration applying step (Step S13) in the first bonding step (Step S1). This causes the initial ball 11a to be bonded to the lead surface 4.

After the second bonding step, a wire cutting step is performed (Step S4), as shown in FIG. 2. In the wire cutting step, the arm drive motor 16 is first rotatably driven to raise the capillary 12 so that the bonding wire 11 is fed out of the capillary 12 by a predetermined length. Then the capillary 12 is raised again with the bonding wire 11 being clamped (not shown) to cut the tail of the bonding wire 11. This causes the pad surface 2 and the lead surface 4 to be connected electrically through the looped bonding wire 11.

An initial ball forming step is lastly performed (Step S5). In the initial ball forming step, the tail (tip end) of the bonding wire 11 cut in the wire cutting step (Step S4) undergoes discharging with an electric flame-off, for example, to be formed with a spherical initial ball 11a.

[Second Exemplary Embodiment]

Figure 9:
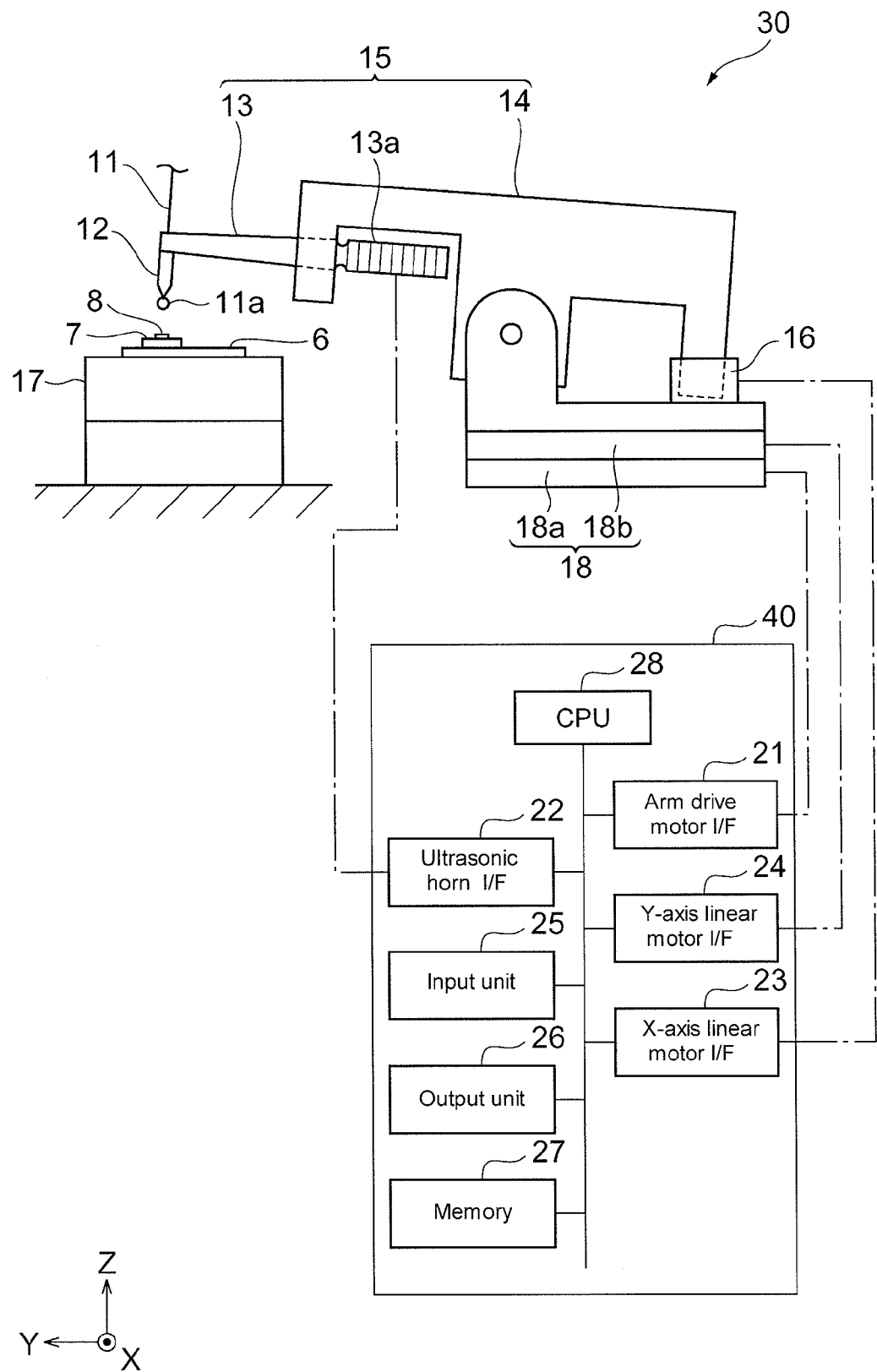
FIG. 9 illustrates an example of a bump-bonding apparatus according to a second exemplary embodiment.

FIG. 9 illustrates an example of a bump-bonding apparatus according to a second exemplary embodiment. As shown in FIG. 9, the bump-bonding apparatus 30 according to the second exemplary embodiment is configured to form a bump on a pad surface 8 formed on each of one or more semiconductor devices 7 that are bonded to a substrate 6, through bonding of a bonding wire 11 inserted through a capillary 12. The bump-bonding apparatus 30 basically has the same configuration as the wire-bonding apparatus 10 according to the first exemplary embodiment, though different in the bonding target and bonding method. Like the wire-bonding apparatus 10, the bump-bonding apparatus 30 thus includes the capillary 12 through which the bonding wire 11 is inserted, a bonding head 15 for holding the capillary 12, an arm drive motor 16 for rotating (swinging) the bonding head 15, a bonding stage 17 on which the substrate 6 is placed as a bonding target, an XY movement mechanism 18 for moving the bonding head 15 horizontally in X- and Y-axis directions, and a control unit 40 for integrally controlling the bump-bonding apparatus 30. The bonding head 15 is configured to include an ultrasonic horn 13 having the capillary 12 on one end while a vibrator 13a for providing ultrasonic vibration on the other end, and a bonding arm 14 for holding the ultrasonic horn 13.

The control unit 40 is electrically connected to the ultrasonic horn 13 (vibrator 13a), arm drive motor 16, X-axis linear motor 18a, and Y-axis linear motor 18b to control the ultrasonic horn 13, arm drive motor 16, X-axis linear motor 18a, and Y-axis linear motor 18b for formation of a bump on the pad surface 8 of the semiconductor device 7.

That is, the control unit 40 has a pressure contact feature (means) for bringing an initial ball 11a of the bonding wire 11 into pressure contact with the pad surface 8 of the semiconductor device 7 bonded to the substrate 6 that is placed on the bonding stage 17 and a scrubbing feature (means) for spirally rotating the capillary 12 in a direction perpendicular to the direction of pressure on the initial ball 11a when the initial ball 11a is in pressure contact with the pad surface 8, in a bonding step of bonding the bonding wire 11 inserted through the capillary 12 to the pad surface 8 provided on the semiconductor device 7.

The control unit 40 is therefore provided with an arm drive motor I/F 21 for transmitting and receiving a signal to/from the arm drive motor 16, an ultrasonic horn I/F 22 for transmitting and receiving a signal to/from the ultrasonic horn 13, an X-axis linear motor I/F 23 for transmitting and receiving a signal to/from the X-axis linear motor 18a, a Y-axis linear motor I/F 24 for transmitting and receiving a signal to/from the Y-axis linear motor 18b, an input unit 25 serving as an input device such as a keyboard to receive an input of various types of control information from an operator, an output unit 26 serving as a display device such as a monitor to display various types of control information for the control unit 40, a memory 27 for storing various types of programs, and a CPU 28 for bonding control. It is noted that the above-described pressure contact and scrubbing features are implemented, respectively, by a pressure contact program and a scrubbing program stored in a storage device or the like.

Figure 10:
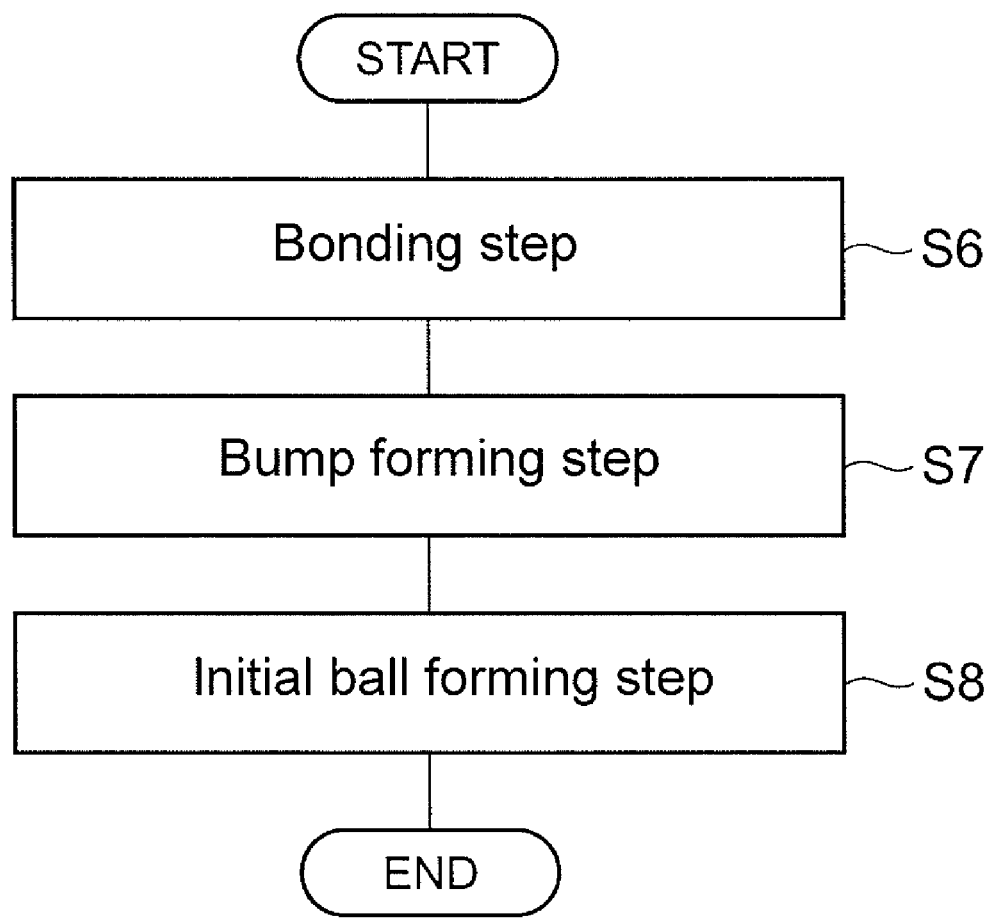
FIG. 10 is a flow chart illustrating a bonding method using the bump-bonding apparatus according to an exemplary embodiment of the present invention.
Figure 11:
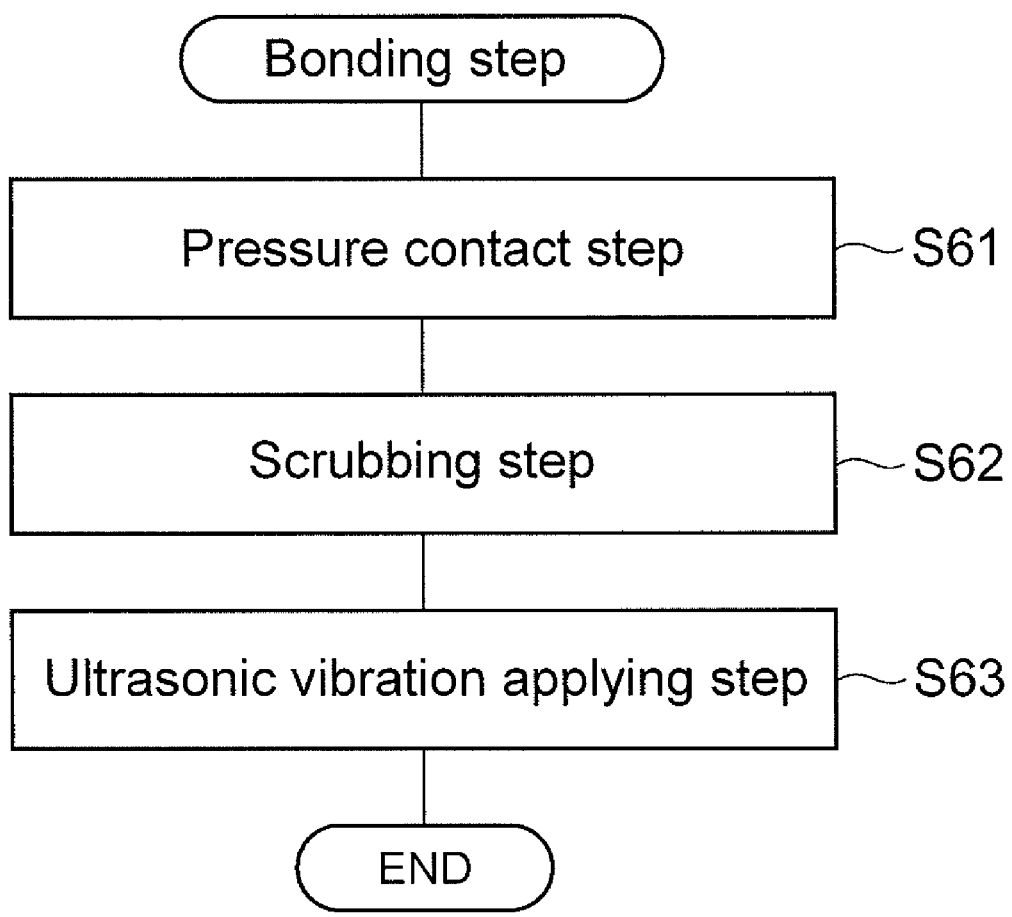
FIG. 11 is a flow chart illustrating the bonding step in FIG. 10 according to an exemplary embodiment of the present invention.

Next will be described a processing operation of the bump-bonding apparatus 30 with reference to FIGS. 10 and 11. FIG. 10 is a flow chart illustrating a bonding method using the bump-bonding apparatus, and FIG. 11 is a flow chart illustrating the bonding step in FIG. 10. It is noted that the processing operation of the bump-bonding apparatus 30 to be described hereinafter is implemented by the pressure contact feature as a pressure contact program and the scrubbing feature as a scrubbing program based on a command from the control unit 40.

First of all, the bump-bonding apparatus 30 runs a bonding step (Step S6), as shown in FIG. 10.

In the bonding step (Step S6), a pressure contact step is first performed (Step S61), as shown in FIG. 11. In the pressure contact step, the capillary 12 is lowered and a predetermined load is applied to the initial ball 11a to bring the initial ball 11a into pressure contact with the pad surface 8, as is the case with the pressure contact step (Step S11) in the first exemplary embodiment.

A scrubbing step is next performed (Step S62). In the scrubbing step, when the initial ball 11a is brought into pressure contact with the pad surface 8, the bonding head 15 is moved and the capillary 12 undergoes a scrubbing motion to be rotated spirally, as is the case with the scrubbing step (Step S12) in the first exemplary embodiment. The scrubbing motion causes the initial ball 11a and the pad surface 8 to be rubbed together and thereby the oxide film (not shown) forming a superficial layer of the pad surface 8 to be broken, so that the initial ball 11a is bonded to the pad surface 8. In this case, since the capillary 12 undergoes the scrubbing motion to be rotated spirally, the time and distance where the initial ball 11a and the pad surface 8 are rubbed together when the capillary 12 is rotated at the maximum diameter can be reduced and the force applied to the initial ball 11a can be converged toward the center of rotation. This allows the deformation area 11b not to be expanded but to be reduced.

An ultrasonic vibration applying step is next performed (Step S63). In the ultrasonic vibration applying step, ultrasonic vibration is provided from the vibrator 13a of the ultrasonic horn 13 and applied to the initial ball 11a, as is the case with the ultrasonic vibration applying step (Step S13) in the first exemplary embodiment.

After the bonding step, a bump forming step is performed (Step S7), as shown in FIG. 10. In the bump forming step, the arm drive motor 16 is first rotatably driven to raise the capillary 12 so that the bonding wire 11 is fed out of the capillary 12 by a predetermined length. Then the capillary 12 is raised again with the bonding wire 11 being clamped (not shown) to cut the tail of the bonding wire 11. This causes the initial ball 11a bonded to the pad surface 8 to be formed into a bump on the pad surface 8.

An initial ball forming step is lastly performed (Step S8). In the initial ball forming step, the tail (tip end) of the bonding wire 11 cut in the wire cutting step (Step S4) undergoes discharging with an electric flame-off, for example, to be formed with a spherical initial ball 11a, as is the case with the initial ball forming step (Step S5) in the first exemplary embodiment.

PRACTICAL EXAMPLE

Next will be described a practical example of the present invention.

In the practical example of the present invention, a wire-bonding apparatus 10 according to the first exemplary embodiment was used for wire bonding.

In a comparative example to the practical example, a wire-bonding apparatus configured to perform first and second bonding steps including no scrubbing step was used for wire bonding.

A pad surface 2 of a semiconductor device 1 on which an initial ball 11a was bonded in the first bonding step was observed to evaluate the size of the initial ball 11a bonded to the pad surface 2 (evaluation of the first bonding step). A lead surface 4 of a substrate 3 on which a bonding wire 11 was bonded in the second bonding step was observed to evaluate the tensile strength of the bonding wire 11 bonded to the lead surface 4 (evaluation of the second bonding step).

[Evaluation of the First Bonding Step]

The size of the initial ball 11a bonded to the pad surface 2 in the first bonding step was first evaluated.

The first bonding step was performed under the following experimental conditions:
(For the Practical example)
Duration of ultrasonic vibration: 10 ms,
Load on the capillary: 130 gf,
Duration of loading: 13 ms,
Scrubbing motion: spiral with a maximum diameter of 10 μm and a frequency of 250 Hz by 3 revolutions, and
(For the Comparative Example)
Duration of ultrasonic vibration: 10 ms,
Load on the capillary: 170 gf,
Duration of loading: 13 ms,
Scrubbing motion: none.

Figure 12A:
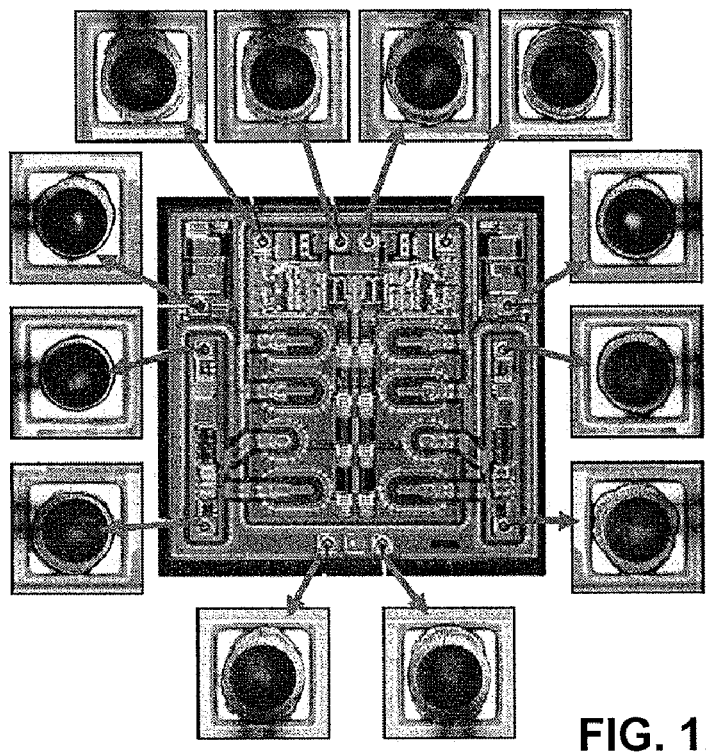
FIG. 12(a) is a close-up photo of a semiconductor device and pad surfaces thereon in a comparative example and FIG. 12(b) is a close-up photo of a semiconductor device and pad surfaces thereon in a practical example according to an exemplary embodiment of the present invention.
Figure 12B:
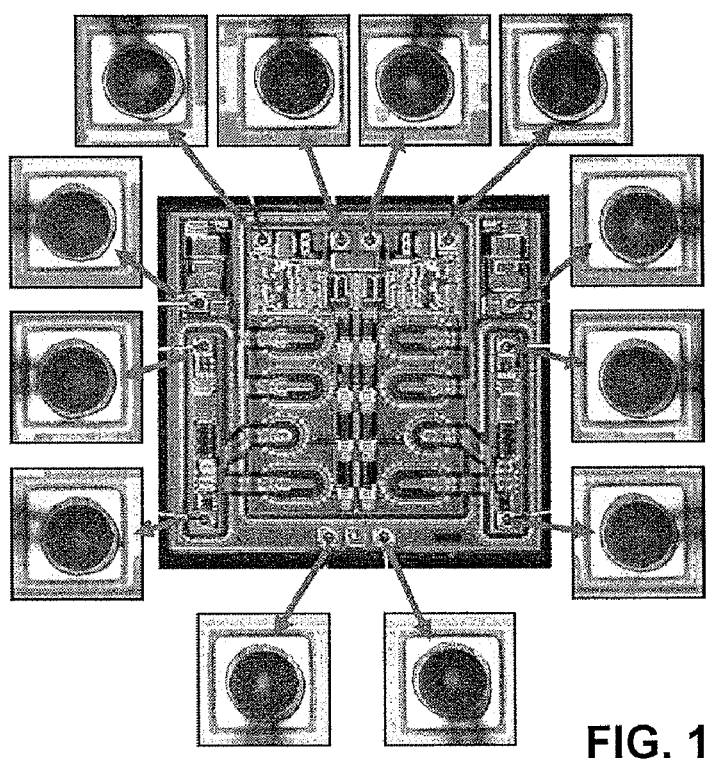

FIG. 12(a) is a close-up photo of a semiconductor device and pad surfaces thereon in the comparative example and FIG. 12(b) is a close-up photo of a semiconductor device and pad surfaces thereon in the practical example. In FIGS. 12(a) and 12(b), a close-up photo of the entire semiconductor device 1 is centered and, around the photo, close-up photos of twelve pad surfaces 2 provided on the semiconductor device 1 are arranged. In the close-up photo of each pad surface 2, the square within the frame corresponds to the pad surface 2, the center circle within the pad surface 2 corresponds to an initial ball 11a, and the ring outside the initial ball 11a corresponds to a deformation area 11b. As is clear from the comparison between FIGS. 12(a) and 12(b), the deformation area 11b is large and the initial ball 11a expands out of the pad surface 2 in the comparative example, while the deformation area 11b is reduced and the initial ball 11a falls within the pad surface 2 in the practical example.

For evaluation of the size of the initial ball 11a, the diameters (in the X- and Y-axis directions perpendicular to each other) of the initial balls 11a bonded to the respective twelve pad surfaces 2 that were provided on the semiconductor device 1 were measured. It is noted that the number of measurements was twelve, corresponding to the number of pad surfaces 2 provided on the semiconductor device 1.

FIG. 13 shows the diameters of the initial balls 11a as a result of evaluation of the practical and comparative examples under the foregoing conditions. It is noted that in FIG. 13, "X" represents the diameter of each initial ball 11a in the X-axis direction, and "Y" represents the diameter of each initial ball 11a in the Y-axis direction perpendicular to the X-axis direction. "Max" represents the maximum value among the measured diameters, "Min" represents the minimum value among the measured diameters, "Ave" represents the average value of the measured diameters, and "σ" represents the standard deviation (variation).

Referring to FIG. 13, it is found that the diameter of the initial ball 11a bonded to each pad surface 2 is smaller in the practical example than in the comparative example. That is, the deformation area 11b of each initial ball 11a due to bonding is smaller in the practical example than in the comparative example. As a result, it can be concluded that in the practical example, spirally rotating the capillary 12 for scrubbing motion allows the deformation area 11b of each initial ball 11a to be reduced when the initial ball 11a is bonded to each pad surface 2.

[Evaluation of the Second Bonding Step]

The tensile strength of the bonding wire 11 bonded to the lead surface 4 in the second bonding step was next evaluated.

The second bonding step was performed under the following experimental conditions:
(For the Practical Example)
Duration of ultrasonic vibration: 4 ms,
Load on the capillary: 50 gf,
Duration of loading: 7 ms,
Scrubbing motion: spiral with a maximum diameter of 5 μm and a frequency of 350Hz by 3 revolutions, and
(For the Comparative Example)
Duration of ultrasonic vibration: 4 ms,
Load on the capillary: 50 gf,
Duration of loading: 7 ms,
Scrubbing motion: linear with a maximum length of 6 μm by 3 strokes.

Figure 14A:
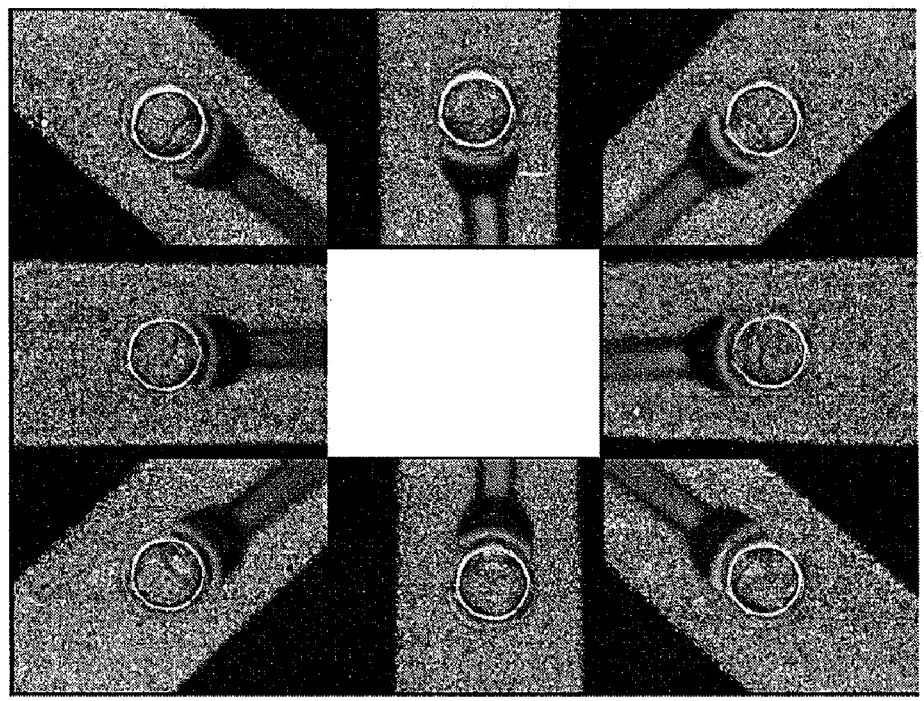
FIG. 14(a) is a close-up photo of lead surfaces in the comparative example according to an exemplary embodiment of the present invention.
Figure 14B:
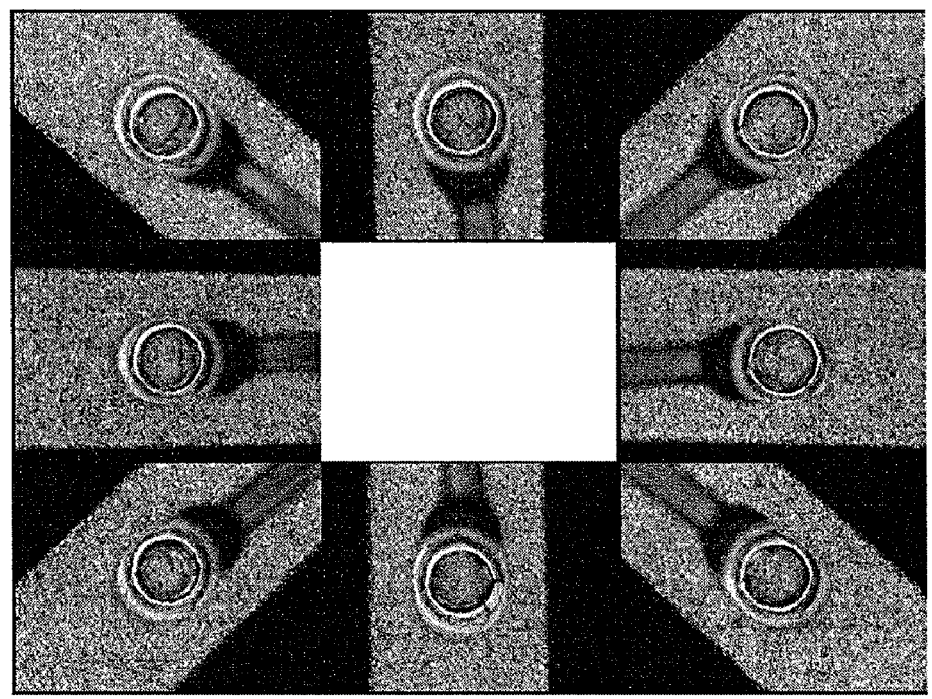
FIG. 14(b) is a close-up photo of lead surfaces in the practical example according to an exemplary embodiment of the present invention.

FIG. 14(a) is a close-up photo of lead surfaces in the comparative example and FIG. 14(b) is a close-up photo of lead surfaces in the practical example. In FIGS. 14(a) and 14(b), lead surfaces 4 are arranged around a semiconductor device 1. In each close-up photo, wide strips extending vertically, horizontally, and obliquely correspond to the respective lead surfaces 4, the center circle on each lead surface 4 corresponds to impressions of the capillary 12, and the line extending from the impression along each lead surface 4 corresponds to the bonding wire 11. As is clear from the comparison between FIGS. 14(a) and 14(b), bringing the capillary 12 into pressure contact with each lead surface 4 causes only a less-visible impression in the comparative example, while a clearly visible impression in the practical example, that is, the bonding wire 11 can be cut more reliably.

For evaluation of the tensile strength of the bonding wire 11, the tensile strength of the bonding wires 11 bonded to the respective twelve lead surfaces 4 that were provided on the semiconductor device 1 were measured. It is noted that the number of measurements was twelve, corresponding to the number of lead surfaces 4 provided on the semiconductor device 1.

FIG. 15 shows the tensile strength of the bonding wires 11 as a result of evaluation of the practical and comparative examples under the foregoing conditions. It is noted that in FIG. 15, "Bonding width" represents the width of each bonding wire 11 bonded to each lead surface 4, and "Tensile strength" represents the tensile strength of each bonding wire 11 bonded to each lead surface 4. "Max" represents the maximum value among the measured parameters, "Min" represents the minimum value among the measured parameters, "Ave" represents the average value of the measured parameters, and "σ" represents the standard deviation (variation).

Referring to FIG. 15, it is found that the tensile strength in the practical example is approximately the same as that in the comparative example. As a result, it can be concluded that in the practical example, spirally rotating the capillary 12 for scrubbing motion allows the bonding wire 11 bonded to each lead surface 4 to be cut reliably with less reduction in the tensile strength of the bonding wire 11.

Thus, in accordance with the wire-bonding apparatus 10 and the bump-bonding apparatus 30 according to the above-described exemplary embodiments, when the initial ball 11a is in pressure contact with the pad surface 2, 8 of the semiconductor device 1, 7, rotating the capillary 12 causes the pad surface 2, 8 and the initial ball 11a to be rubbed together while in pressure contact with each other and thereby the initial ball 11a to be bonded to the pad surface 2, 8. In this case, spirally rotating the capillary 12 allows the force applied to the initial ball 11a to be converged toward the center of rotation and thereby the time and distance where the pad surface 2, 8 and the initial ball 11a are rubbed together at the maximum diameter to be reduced while being secured sufficiently. This allows the deformation area 11b of the initial ball 11a formed due to the movement of the capillary 12 to be reduced, whereby the accuracy of bonding can be improved and the pad pitch serving as the distance between the pad surfaces 2, 8, can be reduced.

Specifying the position where the initial ball 11a comes into contact with the pad surface 2, 8 as a reference position, spirally rotating the capillary 12 while increasing the diameter of the spiral, and thereafter spirally rotating the capillary 12 while reducing the diameter of the spiral to recover the reference position allows the gap between the position where the initial ball 11a is brought into pressure contact with the pad surface 2, 8 and the position where the initial ball 11a is bonded to the pad surface 2, 8 to be reduced. This allows the accuracy of bonding to be further improved and the pad pitch serving as the distance between the pad surfaces 2, 8, to be further reduced.

In accordance with the wire-bonding apparatus 10 according to the first exemplary embodiment, when the capillary 12 and the bonding wire 11 inserted through the capillary 12 are in pressure contact with the lead surface 4 of the substrate 3, the bonding wire 11 is bonded to the lead surface 4 and placed between the capillary 12 and the lead surface 4 to be cut. Then spirally rotating the capillary 12 causes the capillary 12 to be rubbed spirally on the lead surface 4 while in pressure contact with each other, whereby the bonding wire 11 can be cut reliably with a reduced possibility of cutting error.

Specifying the position where the capillary 12 and the bonding wire 11 come into contact with the lead surface 4 as a reference position, spirally rotating the capillary 12 while increasing the diameter of the spiral, and thereafter spirally rotating the capillary 12 while reducing the diameter of the spiral to recover the reference position allows the gap between the position where the capillary 12 is brought into pressure contact with the lead surface 4 and the position of an impression produced on the lead surface 4 when the capillary 12 is brought into pressure contact therewith to be reduced. This allows the accuracy of bonding to be further improved and the lead pitch, the distance between the lead surfaces 4, to be further reduced.

The present invention is not restricted to the preferred exemplary embodiments described heretofore. Although the scrubbing motion is a simple spiral rotation of the capillary 12 in the above description of the exemplary embodiments, if the pad surface 2, 8 or the lead surface 4 is formed (linearly) in a strip having a predetermined width to extend in a predetermined direction, the capillary 12 can be rotated spirally in a flattened manner along the direction of extension of the pad surface 2, 8 or the lead surface 4 as shown in FIGS. 16 and 17, for example. That is, the capillary 12 can be rotated spirally along an ellipse having a long axis in the direction of extension of the pad surface 2, 8 or the lead surface 4 and a short axis in the direction perpendicular to the direction of extension. FIG. 16(a) illustrates a movement trajectory of the capillary when rotated spirally in an obliquely flattened manner and FIG. 16(b) illustrates a command position for driving the X-axis linear motor and the Y-axis linear motor in the case of FIG. 16(a). FIG. 17(a) illustrates a movement trajectory of the capillary when rotated spirally in a laterally flattened manner and FIG. 17(b) illustrates a command position for driving the X-axis linear motor and the Y-axis linear motor in the case of FIG. 17(a).

In the case of bonding the initial ball 11a to the pad surface 2, 8, the capillary 12 is rotated spirally in a flattened manner along the direction of extension of the pad surface 2, 8, which allows the shape of the initial ball 11a to be bonded to the pad surface 2, 8 to be accommodated to the shape of the pad surface. This allows the accuracy of bonding to be improved even for the pad surface 2, 8 extending in any direction. In contrast, in the case of bonding the bonding wire 11 to the lead surface 4, the capillary 12 is rotated spirally in a flattened manner along the direction of extension of the lead surface 4, which allows the shape of an impression of the capillary 12 produced on the lead surface 4 to be accommodated to the shape of the lead surface 4. This also allows the accuracy of bonding to be improved even for the lead surface 4 extending in any direction.

Although the capillary 12 is rotated spirally three revolutions as a scrubbing motion in the above description of the exemplary embodiments, any number of revolutions can be adopted and there is no particular limitation on the number of revolutions for the rotation with diameter increase, at the maximum diameter, and with diameter reduction. However, the revolution at the maximum diameter is preferably only one to prevent the deformation area 11b of the initial ball 11a from expanding.

The present invention is applicable to bonding apparatuses that perform bonding onto a bonding target such as a semiconductor device.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A method of manufacturing a semiconductor device, the method comprising:
   a pressure contact step of bringing an initial ball formed at a tip end of a bonding wire that is inserted through a capillary into pressure contact with a pad surface of a bonding target placed on a bonding stage; and
   a scrubbing step of spirally rotating the capillary in a direction perpendicular to a direction of pressure on the initial ball when the initial ball is in pressure contact with the pad surface;
   wherein the scrubbing step comprises specifying a position where the initial ball comes into contact with the pad surface as a reference position, spirally rotating the capillary from the reference position while increasing a diameter of a spiral, and thereafter spirally rotating the capillary while reducing the diameter of the spiral to recover the reference position.

2. The method of manufacturing a semiconductor device according to claim 1, wherein the scrubbing step comprises, when the pad surface has an extended shape, spirally rotating the capillary in a flattened manner along the direction of extension of the pad surface.

3. A method of manufacturing a semiconductor device, the method comprising:
   a pressure contact step of bringing a capillary with a bonding wire inserted therethrough and the bonding wire inserted through the capillary into pressure contact with a lead surface of a bonding target placed on a bonding stage; and
   a scrubbing step of spirally rotating the capillary in a direction perpendicular to a direction of pressure on the capillary when the capillary is in pressure contact with the lead surface;
   wherein the scrubbing step comprises specifying a position where the capillary comes into contact with the lead surface as a reference position, spirally rotating the capillary from the reference position while increasing a diameter of a spiral, and thereafter spirally rotating the capillary while reducing the diameter of the spiral to recover the reference position.

4. The method of manufacturing a semiconductor device according to claim 3, wherein the scrubbing step comprises, when the lead surface has an extended shape, spirally rotating the capillary in a flattened manner along a direction of extension of the lead surface.

* * * * *